United States Patent
Chou et al.

(10) Patent No.: US 12,446,294 B2
(45) Date of Patent: Oct. 14, 2025

(54) METHOD OF MANUFACTURING SEMICONDUCTOR DEVICES HAVING DIFFERENT GATE DIELECTRIC THICKNESS WITHIN ONE TRANSISTOR

(71) Applicant: TAIWAN SEMICONDUCTOR MANUFACTURING COMPANY, LTD., Hsinchu (TW)

(72) Inventors: Jen-Chun Chou, Taoyuan (TW); Tung-Wen Cheng, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/874,279

(22) Filed: Jul. 26, 2022

(65) Prior Publication Data

US 2022/0375796 A1    Nov. 24, 2022

Related U.S. Application Data

(62) Division of application No. 16/654,457, filed on Oct. 16, 2019, now Pat. No. 11,424,165.

(51) Int. Cl.
*H10D 84/03* (2025.01)
*H01L 21/762* (2006.01)
(Continued)

(52) U.S. Cl.
CPC ..... *H10D 84/038* (2025.01); *H01L 21/76224* (2013.01); *H10D 30/024* (2025.01);
(Continued)

(58) Field of Classification Search
None
See application file for complete search history.

(56) References Cited

U.S. PATENT DOCUMENTS 9,362,179 B1 * 6/2016 Cheng ............... H10D 30/024
9,564,435 B2    2/2017 Chung et al.
(Continued)

FOREIGN PATENT DOCUMENTS

CN    108269803 A    7/2018
CN    109216458 A    1/2019
(Continued)

OTHER PUBLICATIONS

Non-Final Office Action issued in U.S. Appl. No. 16/654,457, dated Sep. 24, 2021.
(Continued)

*Primary Examiner* — Nilufa Rahim
(74) *Attorney, Agent, or Firm* — STUDEBAKER BRACKETT PLLC

(57) ABSTRACT

In a method for manufacturing a semiconductor device, a fin structure is formed over a substrate, an isolation insulating layer is formed over the substrate such that an upper portion of the fin structure protrudes from the isolation insulating layer, a first dielectric layer is formed on the upper portion of the fin structure, a cover layer is formed on the first dielectric layer, the cover layer is partially removed from an upper part of the upper portion of the fin structure with the first dielectric layer, the first dielectric layer is removed from the upper part of the upper portion of the fin structure, a second dielectric layer is formed on the upper part of the upper portion of the fin structure, and a gate electrode is formed on the second dielectric layer and the first dielectric layer disposed on an lower part of the upper portion of the fin structure.

20 Claims, 14 Drawing Sheets

(51) Int. Cl.
  *H10D 30/01* (2025.01)
  *H10D 30/62* (2025.01)
  *H10D 84/01* (2025.01)
  *H10D 84/83* (2025.01)

(52) U.S. Cl.
  CPC ..... *H10D 30/6211* (2025.01); *H10D 84/0144* (2025.01); *H10D 84/0151* (2025.01); *H10D 84/0158* (2025.01); *H10D 84/834* (2025.01)

(56) References Cited

U.S. PATENT DOCUMENTS

| | | | |
|---|---|---|---|
| 10,026,737 | B1 | 7/2018 | Ching et al. |
| 10,121,875 | B1 | 11/2018 | Ho et al. |
| 10,163,728 | B2 | 12/2018 | Wang et al. |
| 10,388,754 | B2 | 8/2019 | Cai et al. |
| 10,403,550 | B2 | 9/2019 | Chiang et al. |
| 10,714,598 | B2 | 7/2020 | Wang et al. |
| 10,937,783 | B2 | 3/2021 | Chang et al. |
| 2005/0019993 | A1 | 1/2005 | Lee et al. |
| 2008/0157162 | A1* | 7/2008 | Doyle ................. H01L 29/7841 438/257 |
| 2013/0196478 | A1 | 8/2013 | Chang et al. |
| 2014/0144518 | A1 | 5/2014 | Bohringer et al. |
| 2014/0191324 | A1* | 7/2014 | Cai ................... H01L 29/66477 438/283 |
| 2014/0213037 | A1 | 7/2014 | LiCausi et al. |
| 2015/0380410 | A1 | 12/2015 | Ching et al. |
| 2016/0005735 | A1 | 1/2016 | Costrini et al. |
| 2017/0033013 | A1 | 2/2017 | Kim et al. |
| 2017/0110476 | A1* | 4/2017 | Ching ............... H01L 27/11807 |
| 2017/0236917 | A1 | 8/2017 | Nowak et al. |
| 2018/0033870 | A1 | 2/2018 | Huang et al. |
| 2018/0090604 | A1 | 3/2018 | Bu et al. |
| 2018/0315857 | A1* | 11/2018 | Li ....................... H10D 64/017 |
| 2019/0088649 | A1 | 3/2019 | Doornbos et al. |
| 2019/0097054 | A1 | 3/2019 | Kim et al. |
| 2019/0295844 | A1* | 9/2019 | Lee ....................... H01L 21/324 |
| 2020/0381432 | A1 | 12/2020 | Lee et al. |

FOREIGN PATENT DOCUMENTS

| | | | | |
|---|---|---|---|---|
| CN | 109427905 | A | | 3/2019 |
| CN | 109979880 | A * | 7/2019 | ..... H01L 21/823431 |
| KR | 10-2017-0040147 | A | | 4/2017 |
| KR | 20170051269 | A | | 5/2017 |
| KR | 20180060918 | A | | 6/2018 |
| KR | 10-2019-0036892 | A | | 4/2019 |
| TW | 201618302 | A | | 5/2016 |
| WO | 2019/003078 | A1 | | 1/2019 |

OTHER PUBLICATIONS

Notice of Allowance issued in U.S. Appl. No. 16/654,457, dated Apr. 18, 2022.

* cited by examiner

METHOD OF MANUFACTURING SEMICONDUCTOR DEVICES HAVING DIFFERENT GATE DIELECTRIC THICKNESS WITHIN ONE TRANSISTOR

RELATED APPLICATIONS

This application is a divisional of U.S. patent application Ser. No. 16/654,457 filed Oct. 16, 2019, the entire content of which is incorporated herein by reference.

BACKGROUND

The disclosure relates to methods of manufacturing semiconductor integrated circuits, and more particularly to a method of manufacturing semiconductor devices including fin field effect transistors (FinFETs). With increasing downscaling of integrated circuits and increasingly demanding requirements of speed of integrated circuits, transistors need to have higher drive currents with increasingly smaller dimensions. Fin Field-Effect Transistors (FinFET) were thus developed. FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins. Since FinFETs have a three-dimensional channel structure, ion implantation processes to the channel require extra care to reduce any geometrical effects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
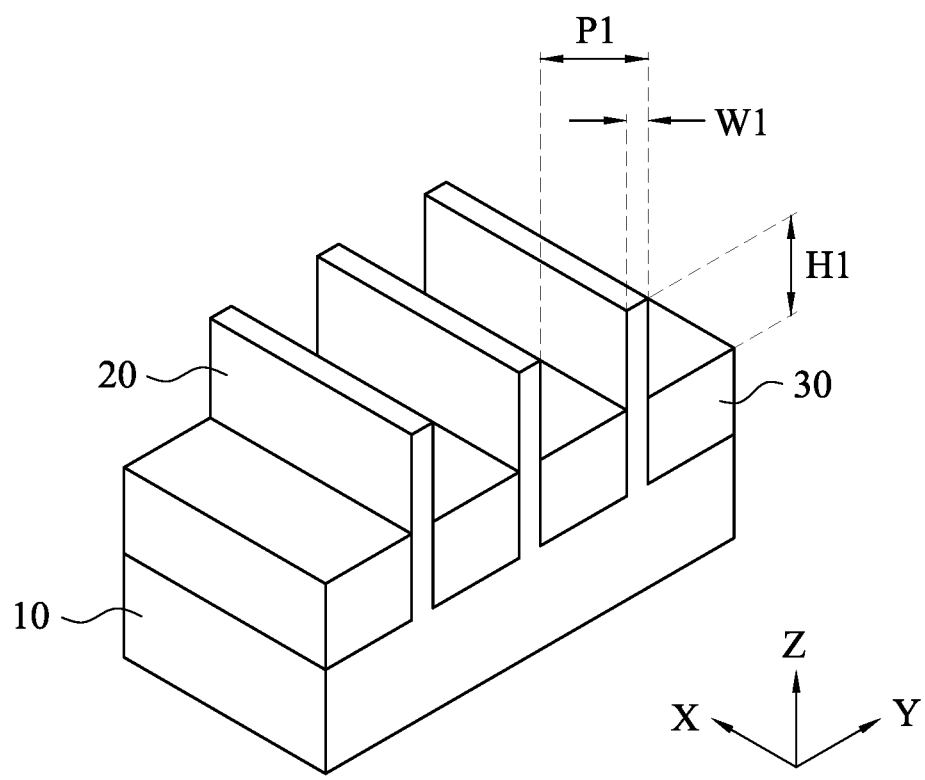
FIG. 1 illustrates one of the various stages of a semiconductor device fabrication process in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a field effect transistor (FET) and its manufacturing method. The embodiments such as those disclosed herein are generally applicable not only to FinFETs but also other FETs.

In a semiconductor device, various transistors, such as high current/power transistors and low power transistors, are disposed. For example, a FinFET having two (or more) fins provides a higher drain current and power, but may sacrifice switching power and leakage current. On the other hand, a FinFET having one fin provides a low power and low leakage, but it may require additional fabrication process, including one or more additional lithography operations. The present disclosure provides a manufacturing operation for a low power semiconductor device.

FIGS. 1-12 illustrate various stages of a semiconductor device fabrication process in accordance with an embodiment of the present disclosure. It is understood that additional operations can be provided before, during, and after processes shown by FIGS. 1-12, and some of the operations described below can be replaced or eliminated, for additional embodiments of the method. The order of the operations/processes may be interchangeable.

First, as shown in FIG. 1, fin structures 20 are formed over a substrate 10 using, for example, a patterning process. The substrate 10 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 10 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 10 may include an epitaxial layer (epi-layer), which may be strained for performance enhancement, and/or may include a silicon-on-insulator (SOI) structure.

The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. The multi-patterning processes combining photolithography and self-aligned processes generally result in forming a pair of fin structures. In FIG. 1, three fin structures 20 are illustrated. However, the numbers of the fin structures is not limited to three. In some embodiments, one or more dummy fin structures are formed adjacent to the fin structure 20 of an active FinFET.

In some embodiments, the entire fin structure 20 is formed of crystalline Si. In other embodiments, at least a channel region of the fin structure 20 includes SiGe where a content of Ge is in a range from about 20 atomic % to 50 atomic %. When a SiGe channel is employed, a SiGe epitaxial layer is formed over a substrate 10 and patterning operations are performed. In some embodiments, one or more buffer semiconductor layers having a lower Ge concentration than the channel region are formed over the substrate 10.

After the fin structures are formed, an isolation insulating layer 30 (e.g., shallow trench isolation (STI)), is disposed over the fin structures 20 and the substrate 10. Prior to forming the isolation insulating region 30, one or more liner layers (not shown) are formed over the substrate 10 and sidewalls of the bottom part of the fin structures 20, in some embodiments. In some embodiments, the liner layers include a first fin liner layer formed on the substrate 10 and sidewalls of the bottom part of the fin structures 20, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

The isolation insulating layer 30 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 30 can be formed by one or more layers of SOG, SiO, SiON, SiOCN or fluorine-doped silicate glass (FSG) in some embodiments.

After forming the isolation insulating layer 30 over the fin structures 20, a planarization operation is performed so as to remove part of the isolation insulating layer 30 and a mask layer (e.g., a pad oxide layer and a silicon nitride mask layer) which is used to pattern the fin structures. The planarization operation may include a chemical mechanical polishing (CMP) and/or an etch-back process. Subsequently, portions of the isolation insulating layer 30 extending over the top surfaces of the fin structures 20, and portions of the liner layers over the top surfaces of the fin structures 20 are removed using, for example, an etch process, chemical mechanical polishing (CMP), or the like. Further, the isolation insulating layer 30 is recessed to expose the upper portion of the fin structures 20. In some embodiments, the isolation insulating layer 30 is recessed using a single etch process, or multiple etch processes. In some embodiments in which the isolation insulating layer 30 is made of silicon oxide, the etch process may be, for example, a dry etch, a chemical etch, or a wet cleaning process. In certain embodiments, the partially removing the isolation insulating layer 30 may be performed using a wet etching process, for example, by dipping the substrate in hydrofluoric acid (HF). In another embodiment, the partially removing the isolation insulating layer 30 may be performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

As shown in FIG. 1, the fin structures 20 extend in the X direction and are arranged in the Y direction with an equal pitch P1. The width W1 of the fin structure 20 at this stage is in a range of about 5 nm to about 40 nm in some embodiments. In certain embodiments, the width W1 of the fin structure 20 is in a range of about 7 nm to about 15 nm. The height H1 of the fin structure 20 measured from the upper surface of the isolation insulating layer 30 at this stage is in a range of about 50 nm to about 300 nm in some embodiments. In certain embodiments, the height H1 of the fin structure 20 is in a range of about 50 nm to about 100 nm. The pitch P1 of the fin structures 20 is in a range of about 10 nm to about 90 nm in some embodiments. In certain embodiments, the width of the fin structure 20 is in a range of about 14 nm to about 45 nm. The space between the fin structures 20 is in a range of about 5 nm to about 80 nm in some embodiments, and may be in a range of about 7 nm to about 15 nm in other embodiments.

Figure 2A:
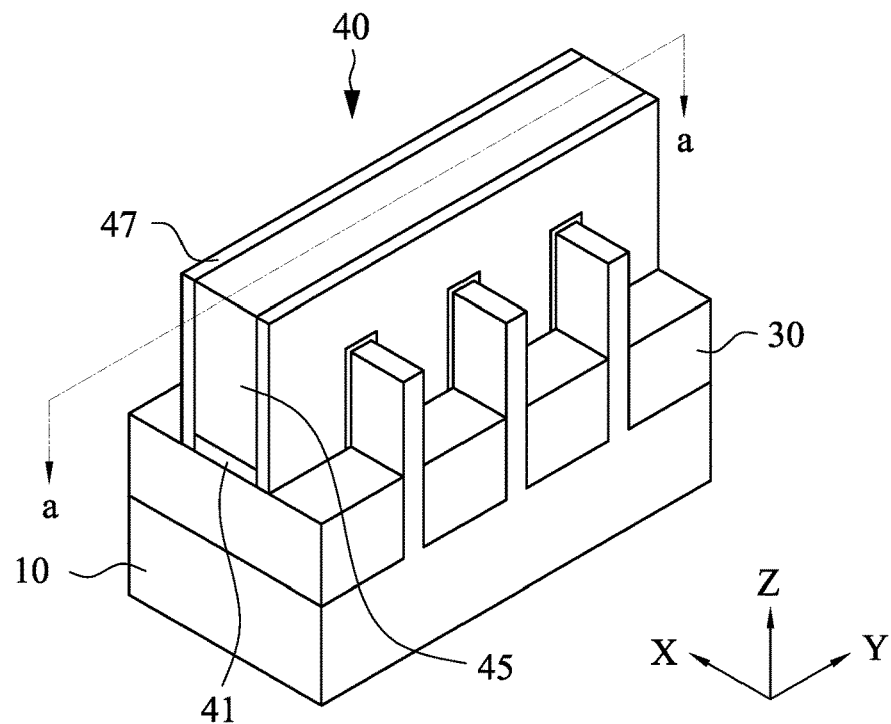
FIGS. 2A and 2B illustrate one of the various stages of a semiconductor device fabrication process in accordance with an embodiment of the present disclosure.
Figure 2B:
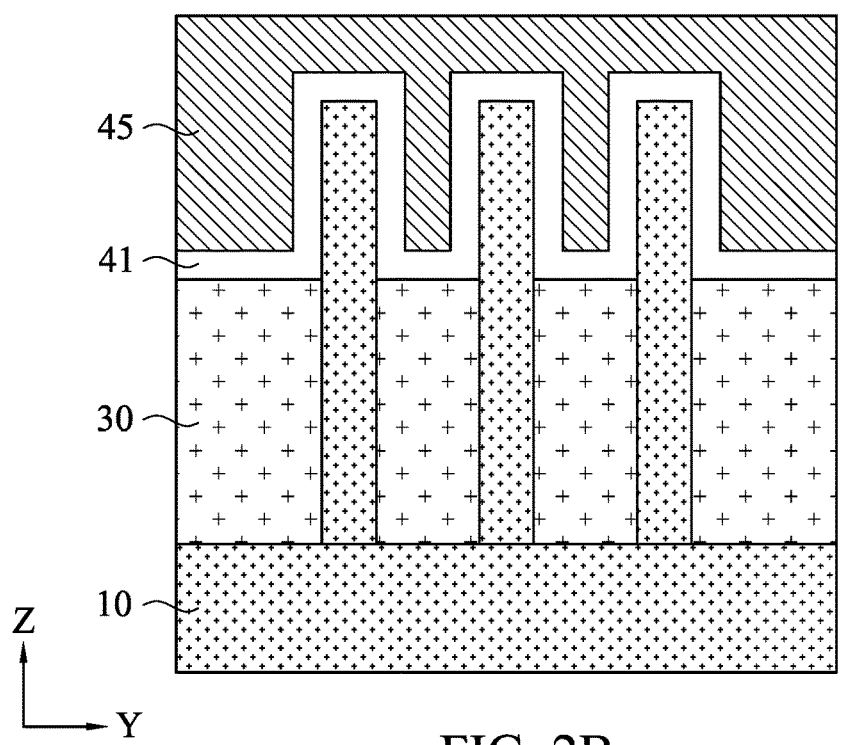

After the fin structures 20 and the isolation insulating layer 30 are formed, a sacrificial gate structure 40 including a sacrificial gate dielectric layer 41 and a sacrificial gate electrode layer 45 are formed over the exposed fin structures 20, which are subsequently used as channel layers, as shown in FIGS. 2A and 2B. FIG. 2A is a perspective view and FIG. 2B is a cross sectional view corresponding to line a-a of FIG. 2A along the Y direction.

The sacrificial gate dielectric layer 41 and the sacrificial gate electrode layer 45 will be subsequently used to define and form the source/drain regions. In some embodiments, the sacrificial gate dielectric layer 41 and the sacrificial gate electrode layer 45 are formed by depositing and patterning a sacrificial gate dielectric layer formed over the exposed fin structures 20 and a dummy electrode layer over the sacrificial gate dielectric layer. The sacrificial gate dielectric layer 41 may be formed by thermal oxidation, CVD, sputtering, or any other methods known and used in the art for forming a sacrificial gate dielectric layer. In some embodiments, the sacrificial gate dielectric layer 41 may be made of one or more suitable dielectric materials such as silicon oxide, silicon nitride, SiCN, SiON, and SiN, low-k dielectrics such as carbon doped oxides, extremely low-k dielectrics such as porous carbon doped silicon dioxide, a polymer such as polyimide, the like, or a combination thereof. In one embodiment, $SiO_2$ is used.

Subsequently, the sacrificial gate electrode layer 45 is formed over the sacrificial gate dielectric layer. In some embodiments, the sacrificial gate electrode layer is a conductive material and is selected from a group including amorphous silicon, poly silicon, amorphous germanium, poly germanium, amorphous silicon-germanium, poly silicon-germanium, metallic nitrides, metallic silicides, metallic oxides, and metals. The sacrificial gate electrode layer may be deposited by PVD, CVD, sputter deposition, or other techniques known and used in the art for depositing conductive materials. Other materials, conductive and nonconductive, may be used. In one embodiment, polysilicon is used.

A mask pattern may be formed over the sacrificial gate electrode layer 45 to aid in the patterning. The mask pattern includes a first mask layer and a second mask layer disposed on the first mask layer. The mask pattern includes one or more layers of $SiO_2$, SiCN, SiON, aluminum oxide, silicon nitride, or other suitable materials. In some embodiments, the first mask layer includes silicon nitride or SiON and the second mask layer includes silicon oxide. By using the mask pattern as an etching mask, the dummy electrode layer is patterned into the sacrificial gate electrode 45. In some embodiments, the dielectric layer is also patterned to define the sacrificial gate dielectric layer. The fin structures 20 extend in the X direction and the sacrificial gate structure 40 extends in the Y direction substantially perpendicular to the X direction. In FIGS. 2A and 2B, one sacrificial gate structure is illustrated. However, the number of the sacrificial gate structures is not limited to one.

Further, sidewall spacers 47 are formed on opposing sidewalls of the sacrificial gate structure 40, as shown in FIG. 2A. The sidewall spacers 47 include one or more dielectric layers. In one embodiment, the sidewall spacers 47 are made of one or more of silicon oxide, silicon nitride, SiOCN, SiCN, aluminum oxide, AlCO or AlCN, or any other suitable dielectric material. A blanket layer of a side-wall insulating material may be formed by CVD, PVD, ALD, or other suitable technique. Then, an anisotropic etching is performed on the side-wall insulating material to form a pair of side-wall insulating layers (spacers) 47 on two main sides of the gate structure. The thickness of the side-wall insulating layers 47 is in a range of about 5 nm to about 30 nm in some embodiments, and in a range of about 10 nm to about 20 nm in other embodiments.

Figure 3:
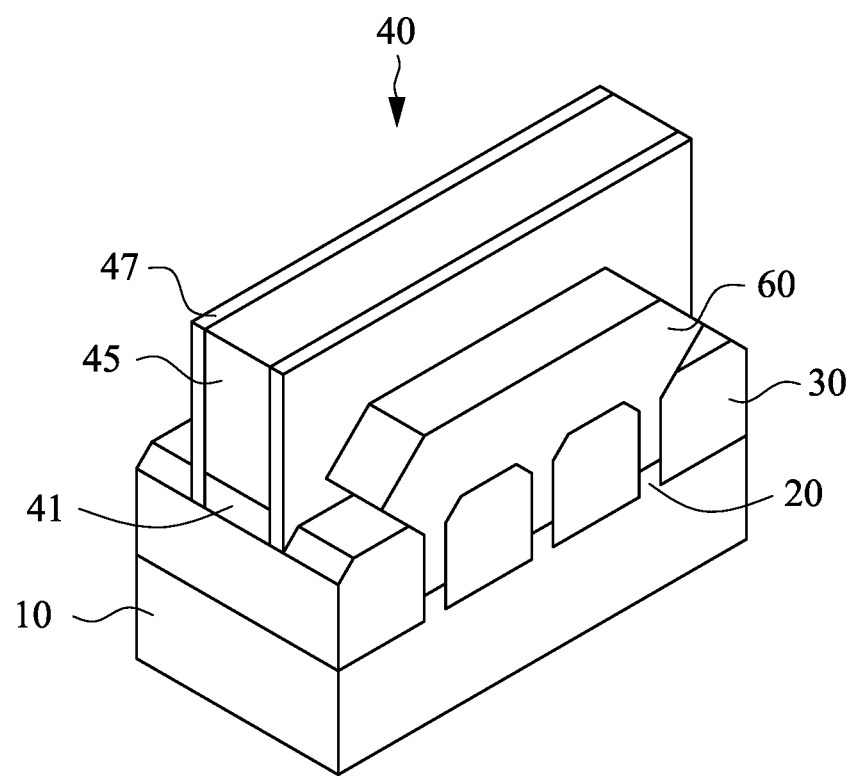
FIG. 3 illustrates one of the various stages of a semiconductor device fabrication process in accordance with an embodiment of the present disclosure.

Subsequently, source/drain regions of the fin structures 20 are recessed down below the upper surface of the isolation insulating layer 30. Then, a source/drain epitaxial layer 60 is formed over the recessed source/drain regions of the fin structures 20, as shown in FIG. 3. In some embodiments, the source/drain epitaxial layer 60 is a merged epitaxial layer as shown in FIG. 3. In other embodiments, the source/drain epitaxial layer 60 is individually formed over the recessed fin structures 20 without merging the adjacent source/drain epitaxial layer.

The materials used for the source/drain epitaxial layer 60 may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form n-type FinFETs, and SiGe or Ge may be used to form p-type FinFETs. In some embodiments, boron (B) is doped in the source/drain epitaxial layer for the p-type FinFETs. Other materials can be used. In some embodiments, the source/drain epitaxial layer 60 includes two or more epitaxial layers with different compositions and/or different dopant concentrations. The source/drain epitaxial layer 60 can be formed by CVD, ALD, molecular beam epitaxy (MBE), or any other suitable methods.

After the source/drain epitaxial layer 60 is formed, an interlayer dielectric (ILD) layer 50 is formed. In some embodiments, before forming the ILD layer, an etch stop layer (ESL) is formed over the source/drain epitaxial layer 60 and sidewall spacers 47. The ESL is made of silicon nitride or a silicon nitride-based material (e.g., SiON, SiCN or SiOCN). The materials for the ILD layer 50 include compounds comprising Si, O, C and/or H, such as silicon oxide, SiCOH and SiOC. Organic materials, such as polymers, may be used for the ILD layer 50.

Figure 4A:
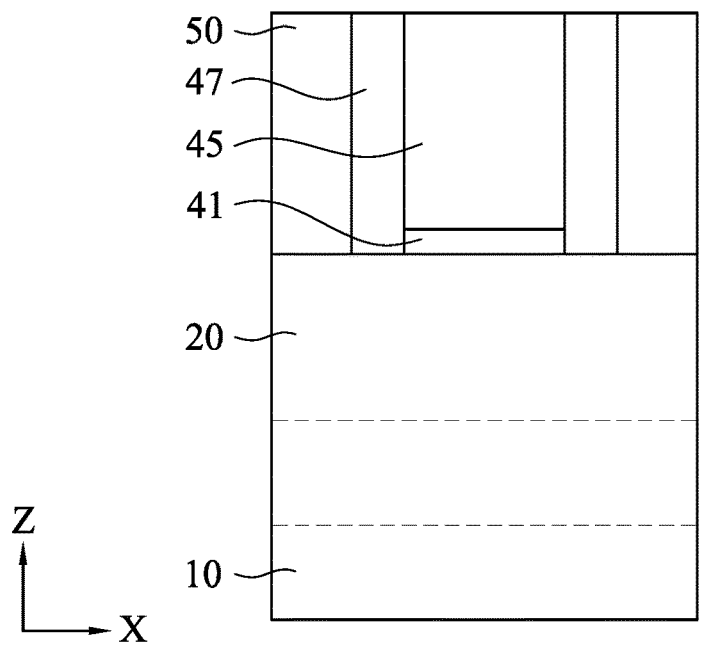
FIGS. 4A and 4B illustrate one of the various stages of a semiconductor device fabrication process in accordance with an embodiment of the present disclosure.
Figure 4B:
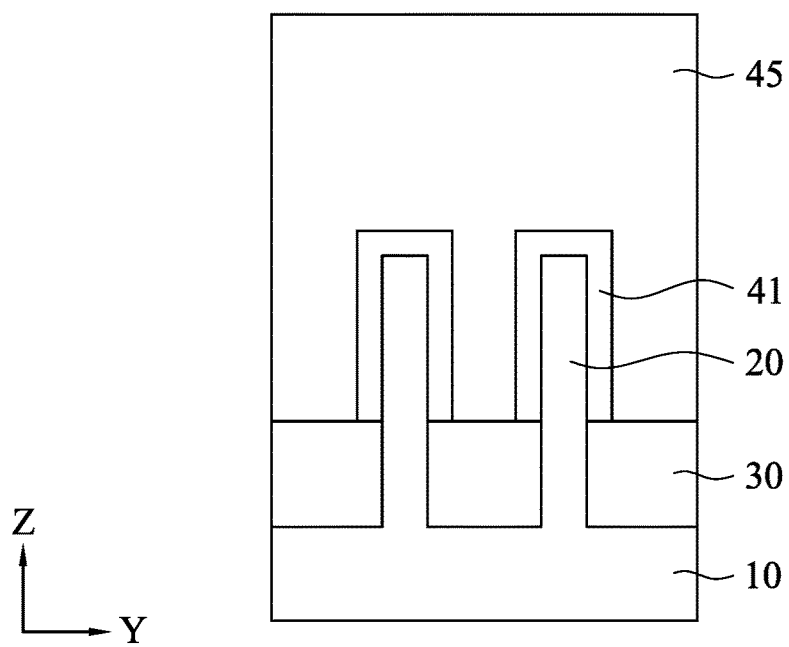

After the ILD layer 50 is formed, a planarization operation, such as an etch-back process and/or a chemical mechanical polishing (CMP) process, is performed to expose the upper surface of the sacrificial gate electrode layer 45, as shown in FIGS. 4A and 4B. FIG. 4A is a cross sectional view along the X direction, and FIG. 4B is a cross sectional view along the Y direction. In FIGS. 4B and 5B, only two fin structures 20 are illustrated for simplicity.

Figure 5A:
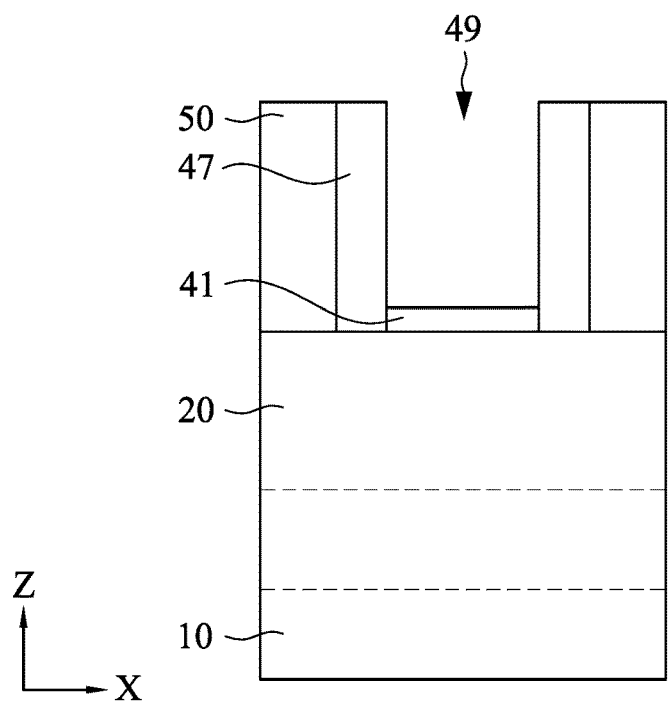
FIGS. 5A, 5B and 5C illustrate one of the various stages of a semiconductor device fabrication process in accordance with an embodiment of the present disclosure.
Figure 5B:
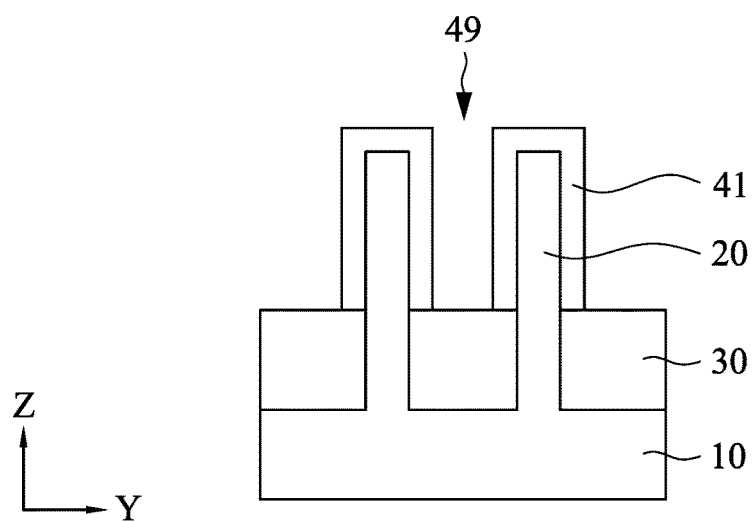

Then, as shown in FIGS. 5A and 5B, the sacrificial gate electrode layer 45 is removed, thereby forming gate spaces 49. When the sacrificial gate electrode layer 45 is polysilicon and the ILD layer 50 is silicon oxide, a wet etchant such as a tetramethylammonium hydroxide (TMAH) solution can be used to selectively remove the sacrificial gate electrode layer.

Figure 5C:
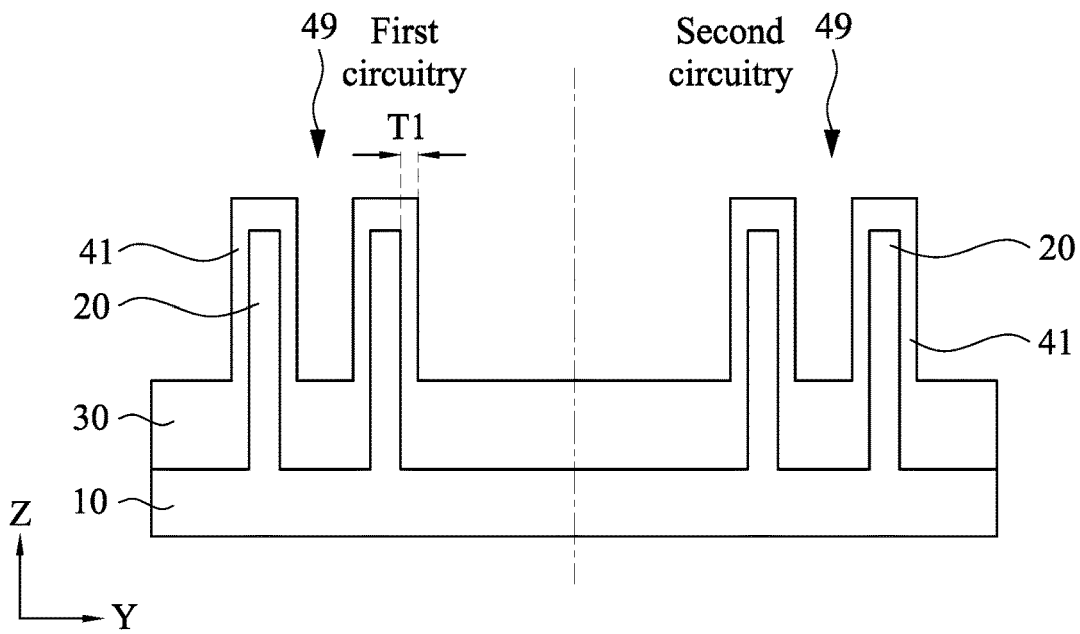

FIG. 5C shows a structure after the sacrificial gate electrode layer 45 is removed. In some embodiments, the semiconductor device includes first circuitry (e.g., core circuits) and second circuitry (e.g., I/O circuits or peripheral circuits) formed on the same substrate 10. The first circuitry requires different power consumption and/or current driving capacity than the second circuitry. In some embodiments, the first circuitry requires lower power consumption and/or current driving capacity than the second circuitry. In some embodiments, the dimensions of the fin structures 20 for the first circuitry and the second circuitry are the same, and in other embodiments, the dimensions of the fin structure 20 for the first circuitry is smaller than those for the second circuitry. In some embodiments, the thickness T1 of the sacrificial gate dielectric layer 41 is in a range from about 0.2 nm to about 4 nm, and is in a range from about 0.3 nm to about 3 nm in other embodiments.

Figure 6:
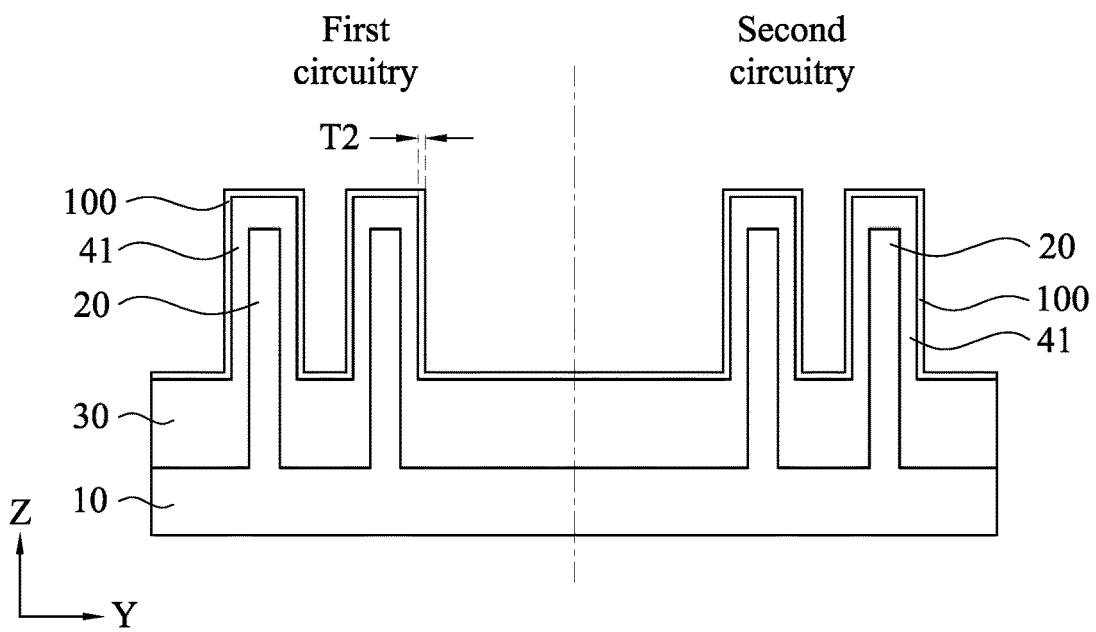
FIG. 6 illustrates one of the various stages of a semiconductor device fabrication process in accordance with an embodiment of the present disclosure.

FIG. 6 illustrates one of the various stages of a semiconductor device fabrication process in accordance with an embodiment of the present disclosure. After the sacrificial gate electrode layer 45 is removed, a cover layer 100 is formed over the sacrificial gate dielectric layer 41. In some embodiments, the cover layer 100 is formed by applying hexamethyldisilazane (HMDS) vapor. In some embodiments, HMDS, reacts with Si—OH groups on the surface of the sacrificial gate dielectric layer 41 to convert Si—OH to Si—OCH$_3$. Thus, a mono layer of Si—OCH$_3$ is formed as the cover layer 100 in some embodiments.

In some embodiments, the HMDS coating operation includes a series of vacuum and inert gas flushing operations. For example, in some embodiments, a vacuum is applied to a deposition chamber. In some embodiments, the pressure in the chamber is reduced to about 10 Torr or less for a period of time ranging from about 30 seconds to about 5 minutes. Then, an inert gas, such as nitrogen, is introduced into the deposition chamber raising the pressure to about 760 Torr. The pressure of the inert gas is maintained at about 760 Torr for about 1 minute to about 10 minutes in some embodiments. A vacuum is then applied again to a pressure of about 10 Torr or less for a period of time ranging from about 30 seconds to about 5 minutes, followed by introducing an inert gas to raise the pressure to about 760 Torr. The operations of applying a vacuum and flushing with inert gas are repeated a plurality of times in some embodiments. The applying the vacuum and flushing operations removes moisture and oxygen from the chamber. Prior to introducing the HMDS, a vacuum of about 1 Torr or less is applied for a period of time ranging from about 30 seconds to about 5 minutes. HMDS is subsequently is introduced into the chamber to a pressure of about 2 Torr to about 20 Torr. In some embodiments, the pressure of the HMDS in the chamber is about 5 Torr to about 10 Torr. The HMDS is applied for a duration of time of about 1 minute to about 20 minutes in some embodiments. In some embodiments, the chamber is heated to a temperature of about 125° C. to about 200° C. during the application of the HMDS to the sacrificial gate dielectric layer 41. In some embodiments, the substrate 10 is heated to a temperature of about 125° C. to about 200° C. by placing it on a hotplate during the application of HMDS. The substrate 10 is heated to about 150° C. in some embodiments. After the application of HMDS, the chamber is purged by one more alternating vacuum applications and inert gas flushing operations in some embodiments. When the deposition operations are completed, the chamber is backfilled with inert gas and the substrate 10 can be removed from the chamber. The application of HMDS is not limited to the forgoing operations and other methods. In some embodiments, the HMDS bubbled with an inert gas is applied to the surface of the sacrificial dielectric layer 41 under an atmospheric pressure.

In some embodiments, the HMDS undergoes an alkylation reaction with the wafer surface in the chamber. For example, when the sacrificial gate dielectric layer 41 is silicon oxide, the HMDS reacts with hydroxyl groups on the surface of sacrificial gate dielectric layer 41 (Si—OH) and introduces alkyl groups (methyl groups) on the surface of the sacrificial gate dielectric layer 41 (Si—O—CH$_3$) in some embodiments. In other embodiments, the mono layer includes a polymer containing C, H, O and N. After the application of HMDS, the substrate 10 is cooled.

In some embodiments, the thickness T2 of the cover layer 100 is in a range from about 0.05 nm to about 2 nm, and is in a range from about 0.1 nm to about 0.5 nm in other embodiments.

In some embodiments, the cover layer 100 is made of another organic material including a polymer. In other embodiments, the cover layer 100 is made of a dielectric material different from the sacrificial gate dielectric layer 41. In certain embodiments, the cover layer 100 is made of silicon nitride formed by ALD.

Figure 7:
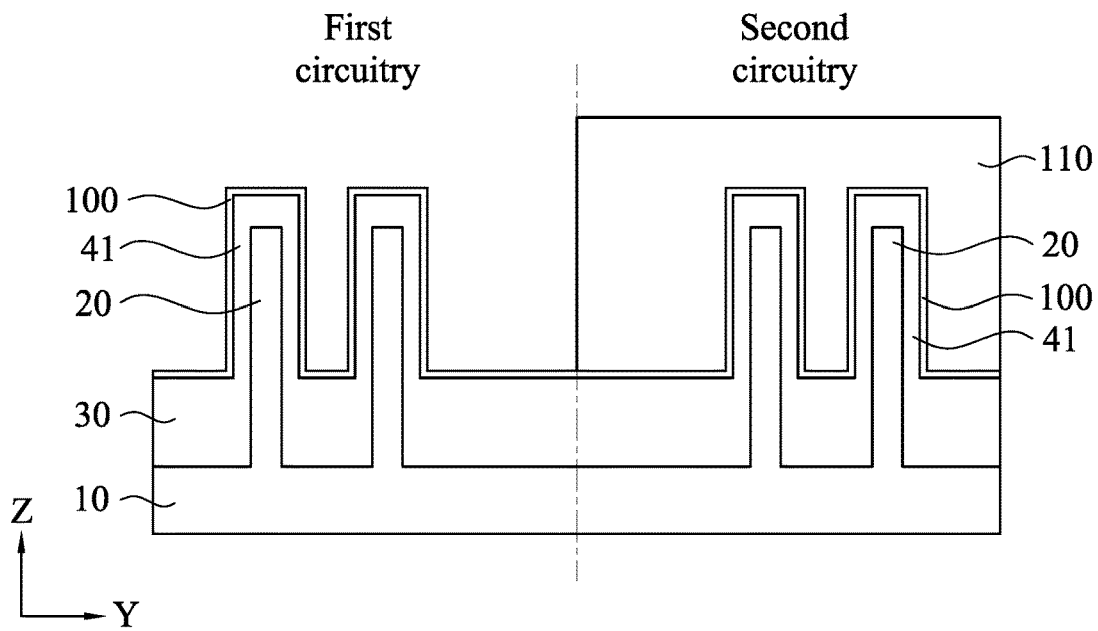
FIG. 7 illustrates one of the various stages of a semiconductor device fabrication process in accordance with an embodiment of the present disclosure.

FIG. 7 illustrates one of the various stages of a semiconductor device fabrication process in accordance with an embodiment of the present disclosure. A photoresist is coated on the cover layer 100, and is patterned to form a protective layer 110 by using one or more lithography operations. The photoresist-coated substrate 10 is subjected to a soft bake at a temperature of about 40° C. to about 150° C. in some embodiments for about 10 seconds to about 10 minutes to remove the photoresist solvent, before irradiation of actinic radiation. In other embodiments, the cover layer 100 is formed before the protective layer 110 is formed.

Figure 8:
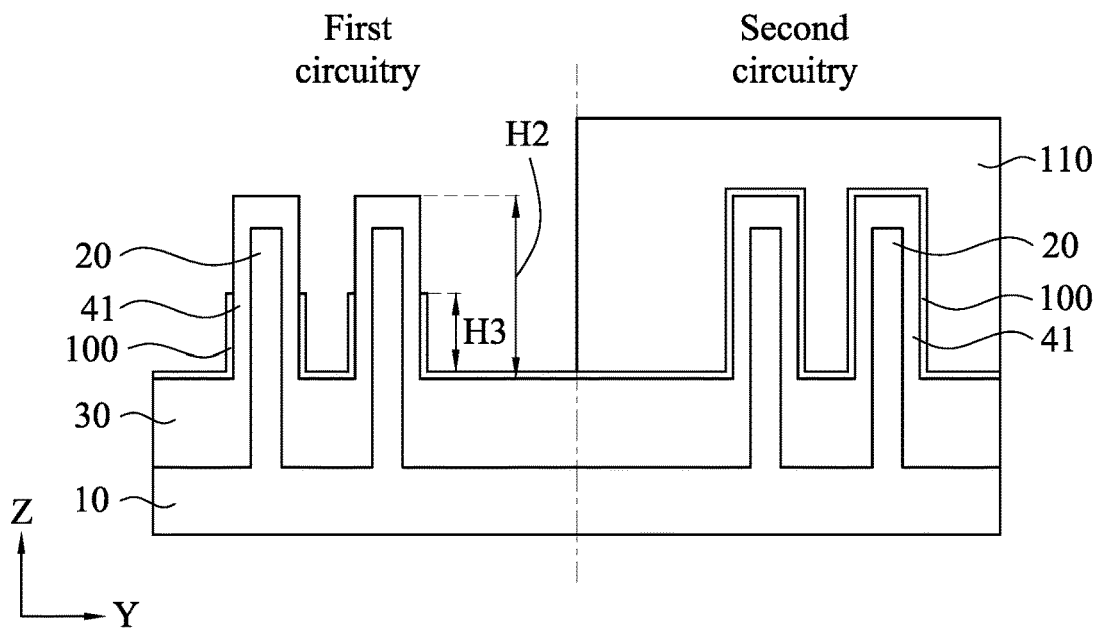
FIG. 8 illustrates one of the various stages of a semiconductor device fabrication process in accordance with an embodiment of the present disclosure.

FIG. 8 illustrates one of the various stages of a semiconductor device fabrication process in accordance with an embodiment of the present disclosure. A part of the cover layer 100 disposed at an upper portion of the fin structure 20 covered with the sacrificial dielectric layer 41 is removed by using one or more etching operations. In some embodiments, oxygen plasma or other plasma generated from a gas containing oxygen (oxygen-based plasma). When input power and a flow rate of oxygen or oxygen containing gas are low, the cover layer 100 is removed from the top portion of the fin structure. In some embodiments, in the etching, the input power is in a range from about 100 W to about 800 W, a pressure is in in a range from about 5 mTorr to about 60 mTorr, and a substrate temperature is in a range from about 25° C. to about 60° C.

In some embodiments, the remaining height H3 of the cover layer 100 is about 30% to about 70% of the height H2 of the top of the sacrificial gate dielectric layer 41 over the fin structure 20 measured from the upper surface of the isolation insulating layer 30.

In other embodiments, the gate space is filled with a material different from the sacrificial gate dielectric layer 41 and the interlayer dielectric layer 50, and an etch-back operation is performed to reduce the thickness of the filled material such that the upper portion of fin structure 20 covered with the sacrificial dielectric layer 41 is exposed. Then, the cover layer 100 is removed, and the filled material is removed.

Figure 9:
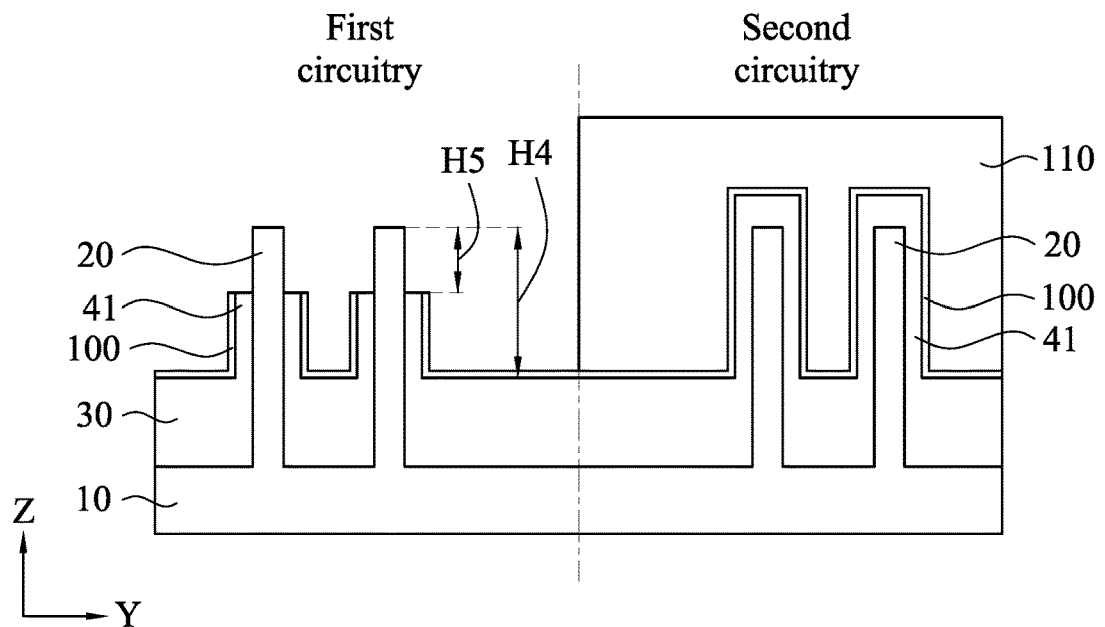
FIG. 9 illustrates one of the various stages of a semiconductor device fabrication process in accordance with an embodiment of the present disclosure.

FIG. 9 illustrates one of the various stages of a semiconductor device fabrication process in accordance with an embodiment of the present disclosure. After the cover layer 100 is partially removed, the exposed sacrificial gate dielectric layer 41 is removed to expose the upper portion of the fin structure 20, as shown in FIG. 9. In some embodiments, the height H5 of the exposed upper portion (an upper part of the upper portion) of the fin structure is about 30% to about 70% of the height H4 of the fin structure 20 (upper portion) measured from the upper surface of the isolation insulating layer 30. In other embodiments, the height H5 is about 40% to about 60% of the height H4.

Figure 10:
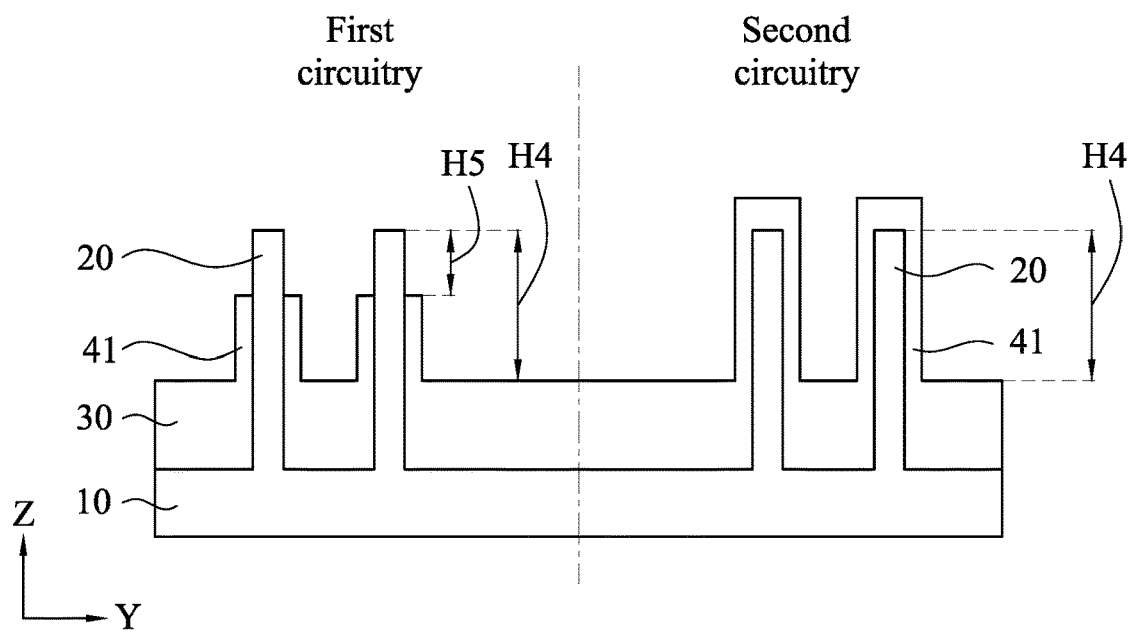
FIG. 10 illustrates one of the various stages of a semiconductor device fabrication process in accordance with an embodiment of the present disclosure.

FIG. 10 illustrates one of the various stages of a semiconductor device fabrication process in accordance with an embodiment of the present disclosure. Subsequently, the remaining protective layer 110 is removed, and further the cover layer 100 is removed as shown in FIG. 10. When the cover layer 100 is made from HMDS, the photo resist layer 110 and the cover layer 100 are removed by oxygen based plasma, in some embodiments.

Figure 11:
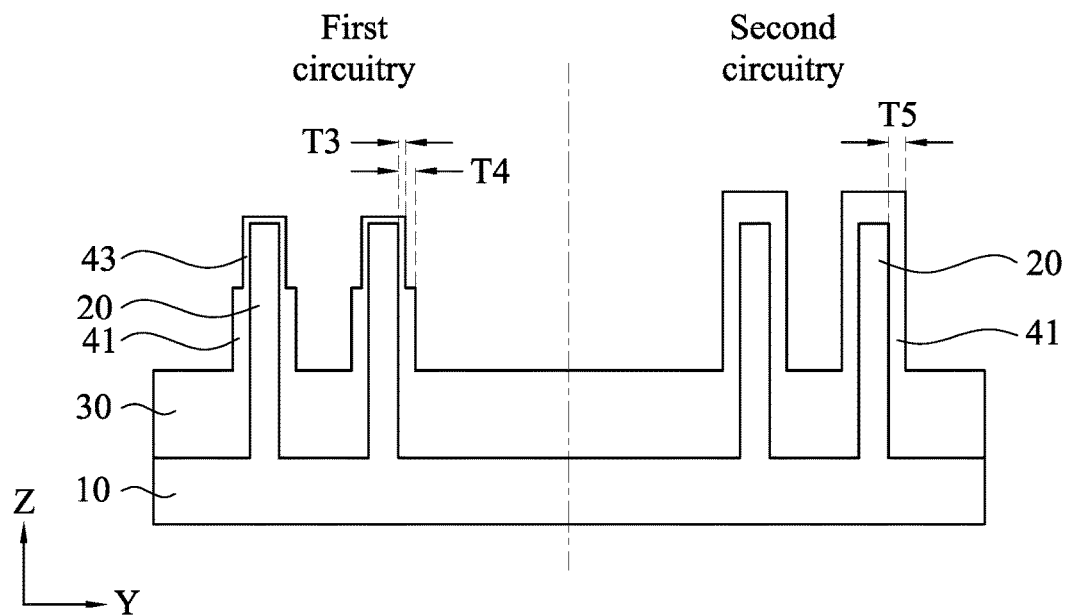
FIG. 11 illustrates one of the various stages of a semiconductor device fabrication process in accordance with an embodiment of the present disclosure.

FIG. 11 illustrates one of the various stages of a semiconductor device fabrication process in accordance with an embodiment of the present disclosure. Subsequently, the fin structures 20 with the sacrificial gate dielectric layer 41 are further oxidized to form an interfacial dielectric layer 43. In some embodiments, one or more of a thermal oxidization process, a plasma oxidization process and/or a chemical oxidization process are utilized to form the interfacial dielectric layer 43. In some embodiments, a process temperature of the thermal oxidization is in a range from about 500° C. to about 800° C. In some embodiments, a process temperature of the plasma oxidization is in a range from about 300° C. to about 500° C. The chemical oxidation may be performed using deionized water+ozone ($DIO_3$), $NH_4OH+H_2O_2+H_2O$ (APM), or other methods. In some embodiments, due to the oxidation operation, the exposed portion of the fin structure becomes thinner after the oxidation operation than before. The amount of thinning is about 0.1 nm to about 0.5 nm in one side of the fin structure. In some embodiments, the thinning results in a step in the fin structure.

In other embodiments, the interfacial layer 43 is formed by a deposition method, such as CVD and ALD. In such a case, the interfacial layer 43 is formed over the remaining sacrificial layer 41.

In some embodiments, the thickness T3 of the interfacial dielectric layer 43 is in a range from about 0.2 nm to about 3.0 nm, and is in a range from about 0.3 nm to about 1.5 nm in other embodiments. In some embodiments, the thickness T4 (>T3) of the remaining sacrificial gate dielectric layer 41 in the first circuitry is in a range from about 0.4 nm to about 4 nm, and is in a range from about 1 nm to about 3 nm in other embodiments. In some embodiments, the thickness T5 of the sacrificial gate dielectric layer 41 in the second circuitry is in a range from about 0.2 nm to about 4 nm, and is in a range from about 0.3 nm to about 3 nm in other embodiments. In some embodiments, T4 is equal to T5, and in other embodiments, T4 is different from T5, i.e., T4>T5 or T4<T5.

Figure 12:
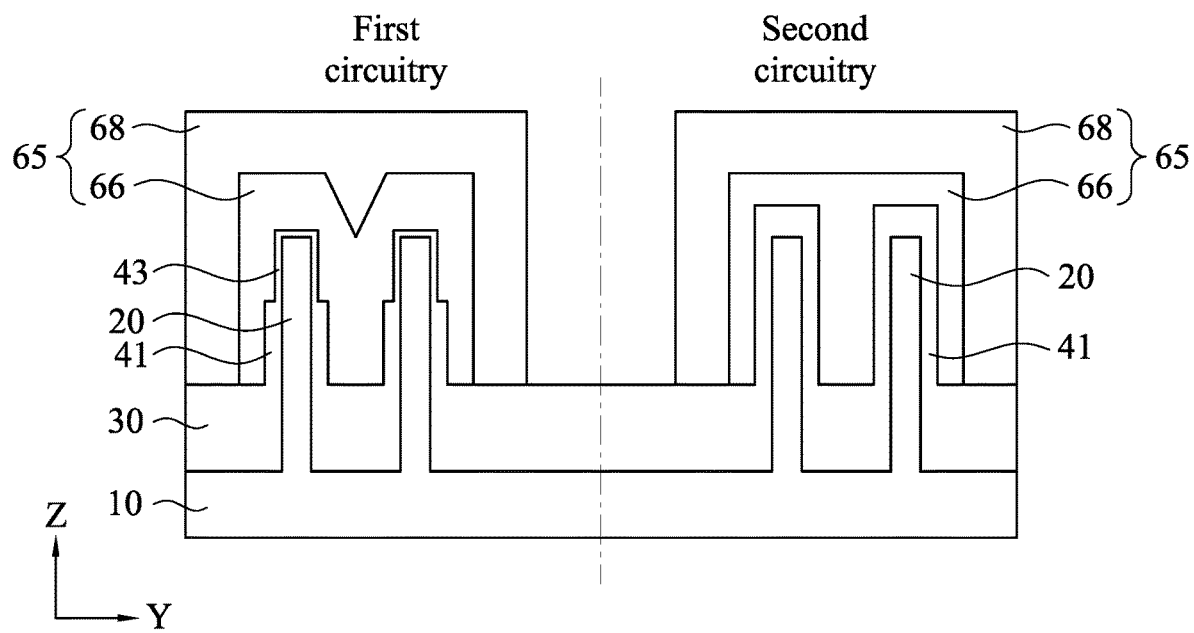
FIG. 12 illustrates one of the various stages of a semiconductor device fabrication process in accordance with an embodiment of the present disclosure.

FIG. 12 illustrates one of the various stages of a semiconductor device fabrication process in accordance with an embodiment of the present disclosure. In some embodiments, the interfacial layer 43 and the sacrificial gate dielectric layer 41 are used as a gate dielectric layer for an FET. In some embodiments, the interfacial layer 43 is removed, and the sacrificial gate dielectric layer 41 is thinned. Subsequently, a gate electrode 65 is formed over the gate dielectric layer. In some embodiments, one or more work function adjustment layers 66 is formed and a main metal layer 66 is formed over the work function adjustment layer 66. The work function adjustment layer 68 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, TiSi and TaSi is used as the work function adjustment layer, and for the p-channel FinFET, one or more of TiAlC, Al, TiAl, TaN, TaAlC, TiN, TiC and Co is used as the work function adjustment layer.

In some embodiments, one or more additional conductive layers, such as a barrier layer made of Ti, Ta, TiN, TiSiN and/or TaN, are formed on the gate dielectric layer.

In some embodiments, the main metal layer 68 includes a metallic material selected from the group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the main metal layer 68 includes a metal selected from a group consisting of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. The work function adjustment layer and the main metal layer may be formed using a suitable process such as atomic layer deposition (ALD), chemical vapor deposition (CVD), physical vapor deposition (PVD), plating, or combinations thereof.

As shown in FIG. 12, a dielectric layer covering the upper portion of the fin structure 20 above the isolation insulating layer 30 have a double-U shape including an upper U-shape formed by dielectric layer 43 and a lower U-shape formed by the sacrificial gate dielectric layer 41 between adjacent two fin structures 20. In some embodiments, due to the double-U shape, a dimple or recessed portion is formed in the work function adjustment layer 66 (and the main metal layer 68) between the fin structures 20 in the first circuitry as shown in FIG. 12.

Figure 13:
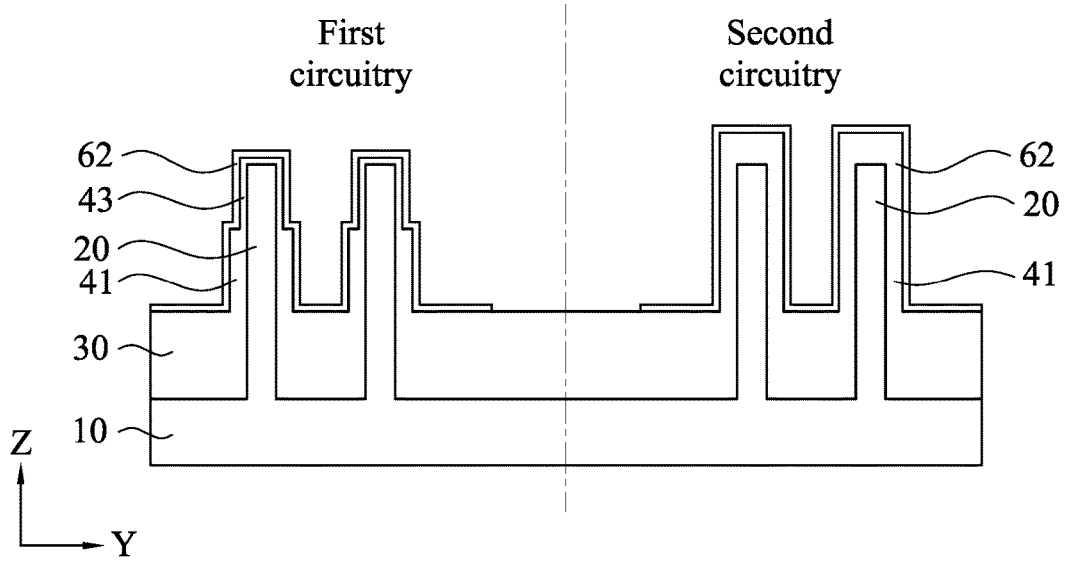
FIG. 13 illustrates one of the various stages of a semiconductor device fabrication process in accordance with another embodiment of the present disclosure.
Figure 14:
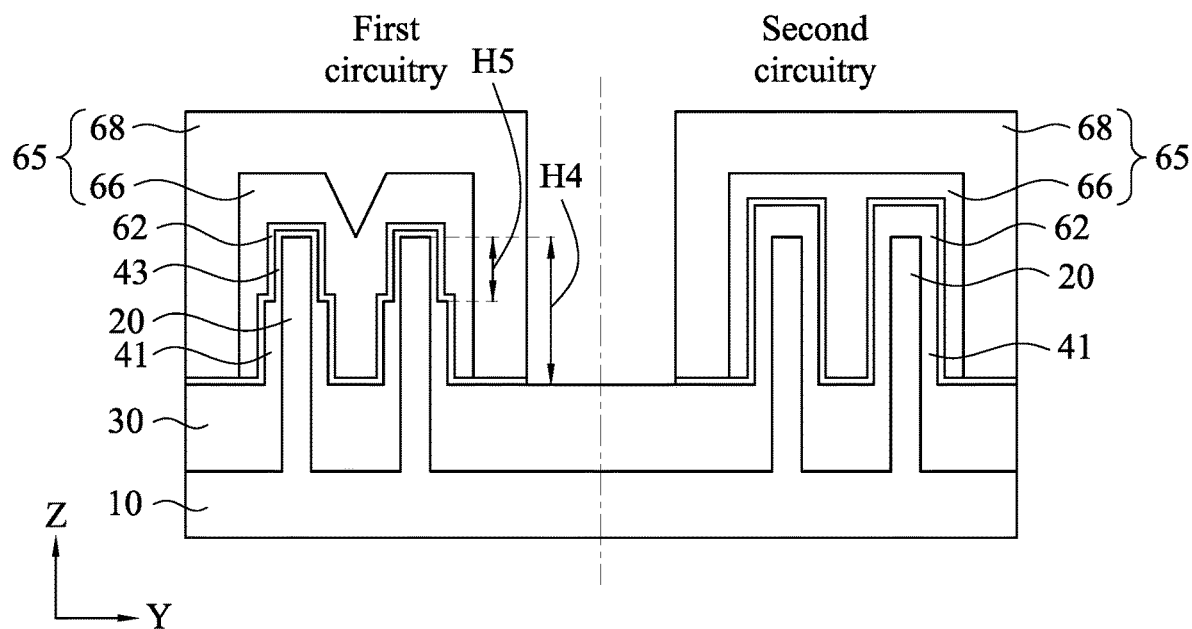
FIG. 14 illustrates one of the various stages of a semiconductor device fabrication process in accordance with another embodiment of the present disclosure.

FIGS. 13-14 illustrate various stages of a semiconductor device fabrication process in accordance with another embodiment of the present disclosure. In the following embodiments, one or more high-k dielectric layer is formed on the sacrificial gate dielectric layer 41 to form a gate dielectric layer, and the interfacial layer 43 and the remaining sacrificial gate dielectric layer 41 in the core first circuitry and the sacrificial gate dielectric layer 41 in the second circuitry are used as a part of a gate dielectric layer.

As shown in FIG. 13, a high-k dielectric layer 62 is formed on the sacrificial gate dielectric layer 41. The high-k gate dielectric layer 62 includes one or more layers of $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials. The gate dielectric layer 60 may be formed by CVD, ALD or any suitable method. The thickness of the high-k dielectric layer 62 is in a range from about 1 nm to about 6 nm in some embodiments. As shown in FIG. 14, a gate electrode 65 is then formed over the high-k dielectric layer.

It is understood that the FinFET undergo further CMOS processes to form various features such as contacts/vias, interconnect metal layers, dielectric layers, passivation layers, etc.

FIGS. 15-22 illustrate various stages of a semiconductor device fabrication process in accordance with another embodiment of the present disclosure. It is understood that additional operations can be provided before, during, and after processes shown by FIGS. 15-22, and some of the operations described below can be replaced or eliminated, for additional embodiments of the method. The order of the operations/processes may be interchangeable. Materials, processes, configurations, dimensions and/or operations as described in the foregoing embodiments can be employed in the following embodiments and the detailed explanation thereof may be omitted.

In the following embodiments, a cover layer 100 is formed before a sacrificial gate electrode 45 is formed over the fin structures 20.

Figure 15:
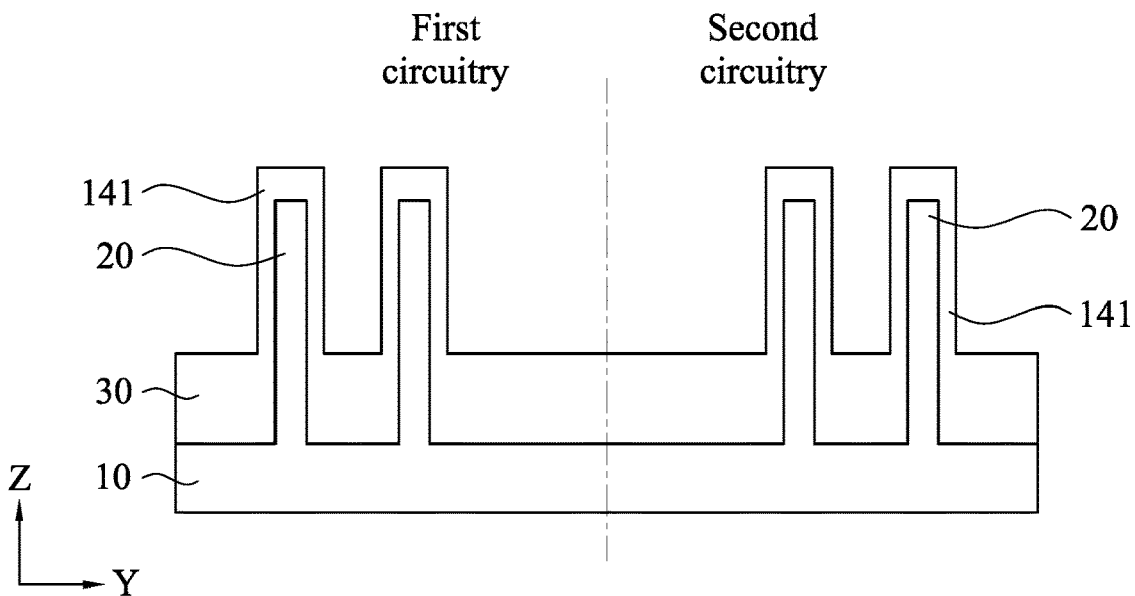
FIG. 15 illustrates one of the various stages of a semiconductor device fabrication process in accordance with another embodiment of the present disclosure.

After the fin structures 20 are formed as shown in FIG. 1, a sacrificial gate dielectric layer 141 is formed over the exposed fin structures 20 as shown in FIG. 15. The sacrificial gate dielectric layer 141 can be formed by the same manner as the sacrificial gate dielectric layer 41.

Figure 16:
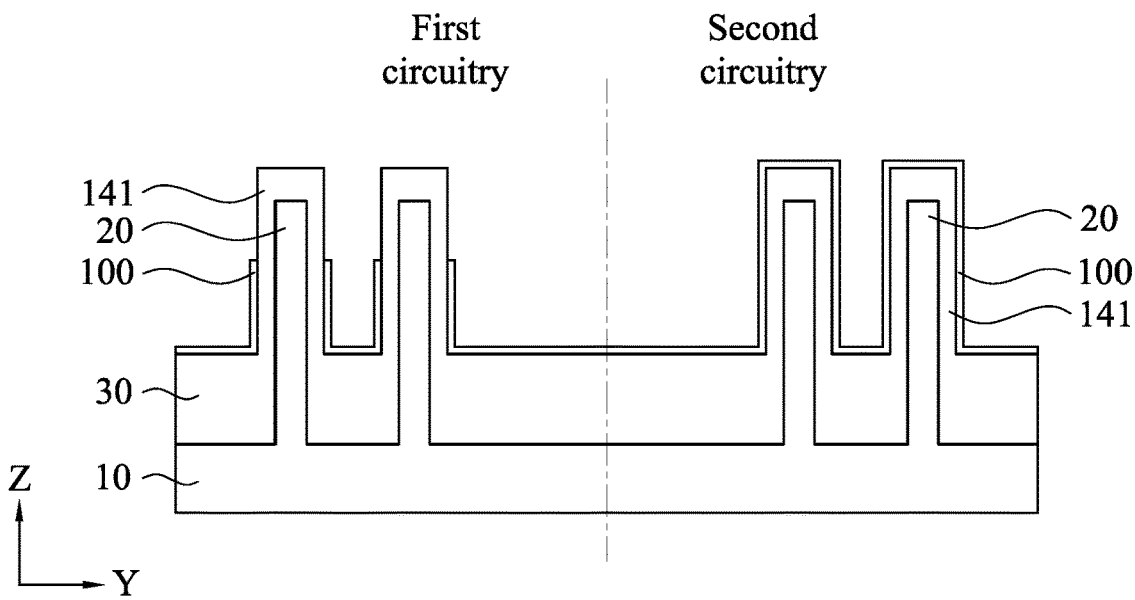
FIG. 16 illustrates one of the various stages of a semiconductor device fabrication process in accordance with another embodiment of the present disclosure.

Then, by using the similar or same operations as explained with respect to FIGS. 6-8, a cover layer 100 is formed. As shown in FIG. 16, the cover layer 100 (e.g., a remaining HMDS) covers the bottom part of the upper portion of the fin structures 20 in the first circuitry and fully covers the upper portion of the fin structures 20 in the second circuitry. The protective layer 110 (see, FIG. 7) in the second circuitry is removed.

Figure 17:
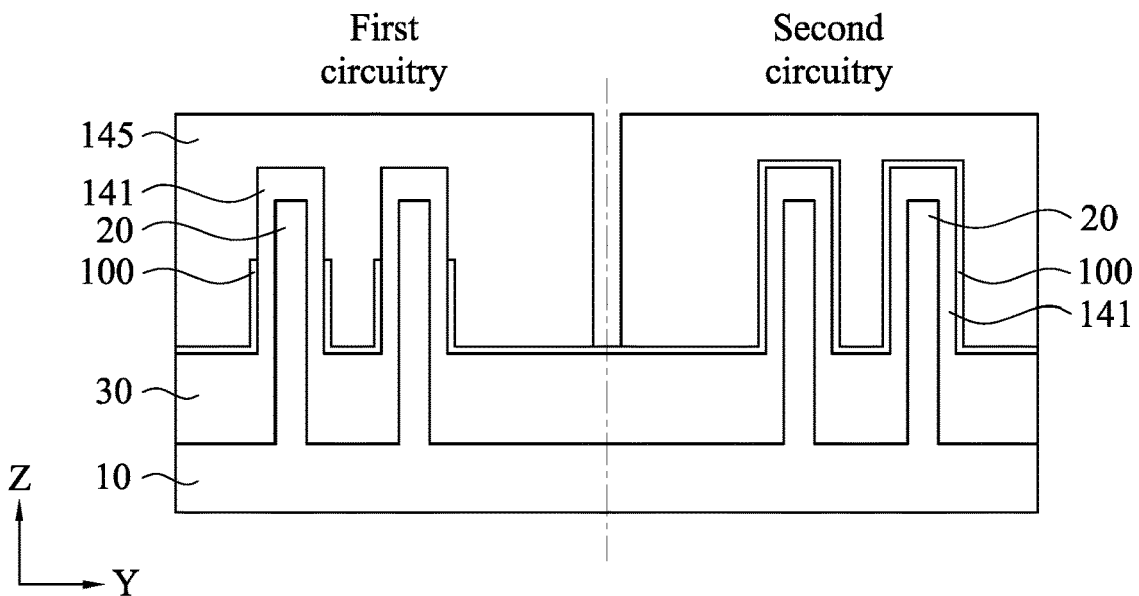
FIG. 17 illustrates one of the various stages of a semiconductor device fabrication process in accordance with another embodiment of the present disclosure.

Subsequently, a sacrificial gate electrode layer 145 is formed over the fin structures with the cover layer 100 and the sacrificial gate dielectric layer 141, as shown in FIG. 17. The sacrificial gate electrode layer 145 can be formed by the same manner as the sacrificial gate electrode layer 145. Further, sidewall spacers are also formed on opposing side faces of the sacrificial gate electrode layer 145. Further, by using the similar or same operations as explained with respect to FIG. 3, a source/drain epitaxial layer 60 is formed.

Figure 18:
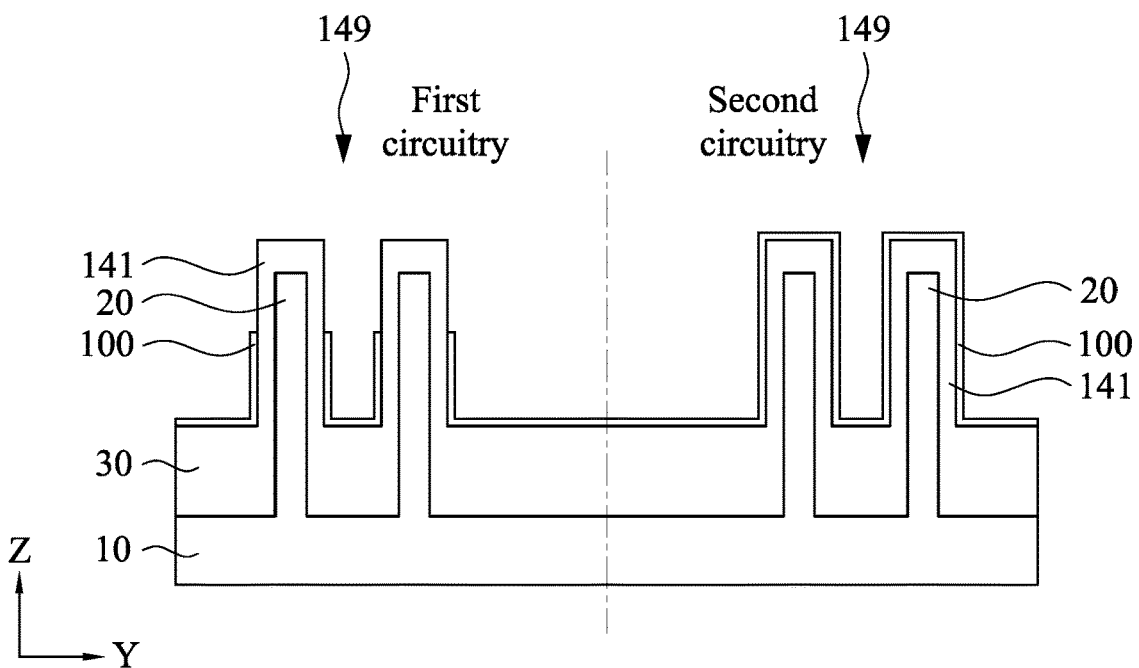
FIG. 18 illustrates one of the various stages of a semiconductor device fabrication process in accordance with another embodiment of the present disclosure.

After the source/drain epitaxial layer 60 is formed, by using the similar or same operations as explained with respect to FIGS. 5A-5C, the sacrificial gate electrode layer 145 is removed, thereby forming gate spaces 149, as shown in FIG. 18.

Figure 19:
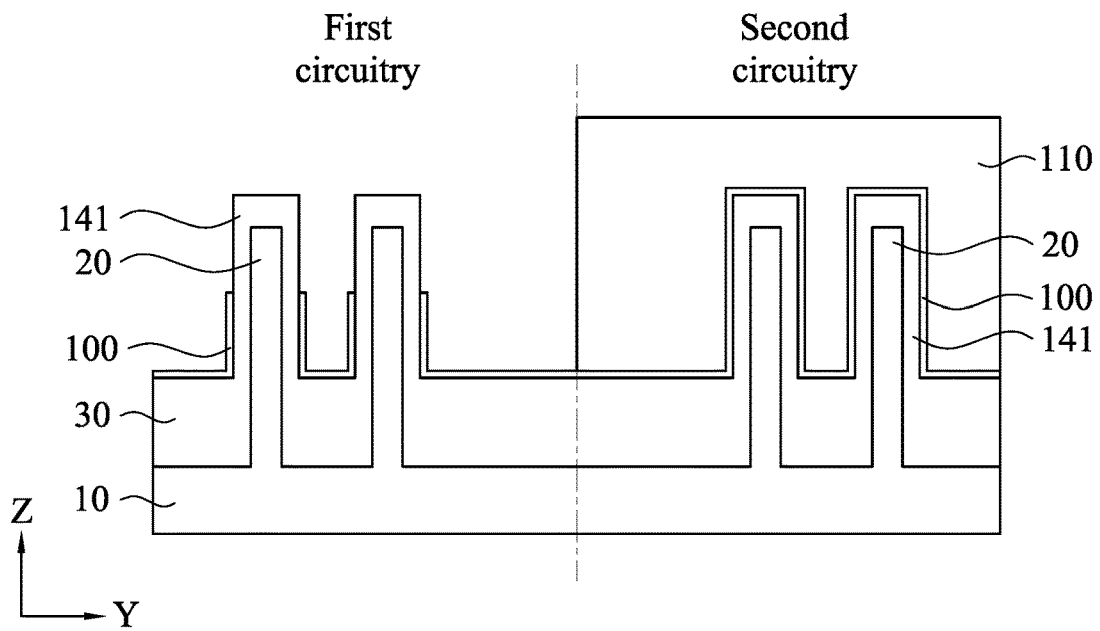
FIG. 19 illustrates one of the various stages of a semiconductor device fabrication process in accordance with another embodiment of the present disclosure.
Figure 20:
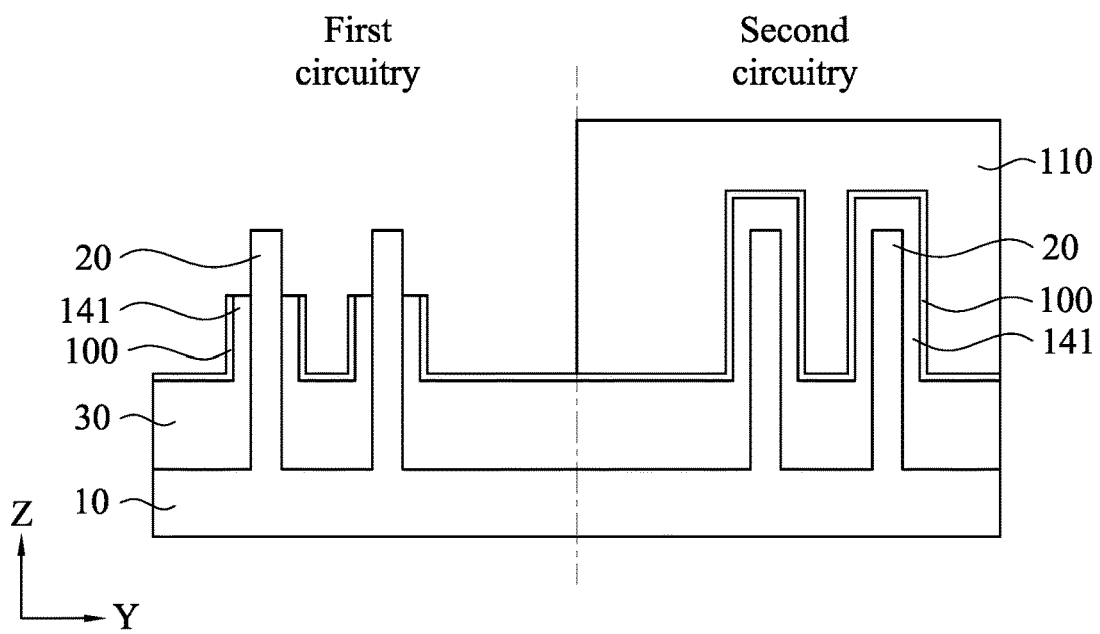
FIG. 20 illustrates one of the various stages of a semiconductor device fabrication process in accordance with another embodiment of the present disclosure.

Then, by using the similar or same operations as explained with respect to FIG. 8, a protective layer 110 is formed as shown in FIG. 19. Further, by using the similar or same operations as explained with respect to FIG. 9, the exposed sacrificial gate dielectric layer 141 is removed to expose the upper portion of the fin structure 20, as shown in FIG. 20.

Figure 21:
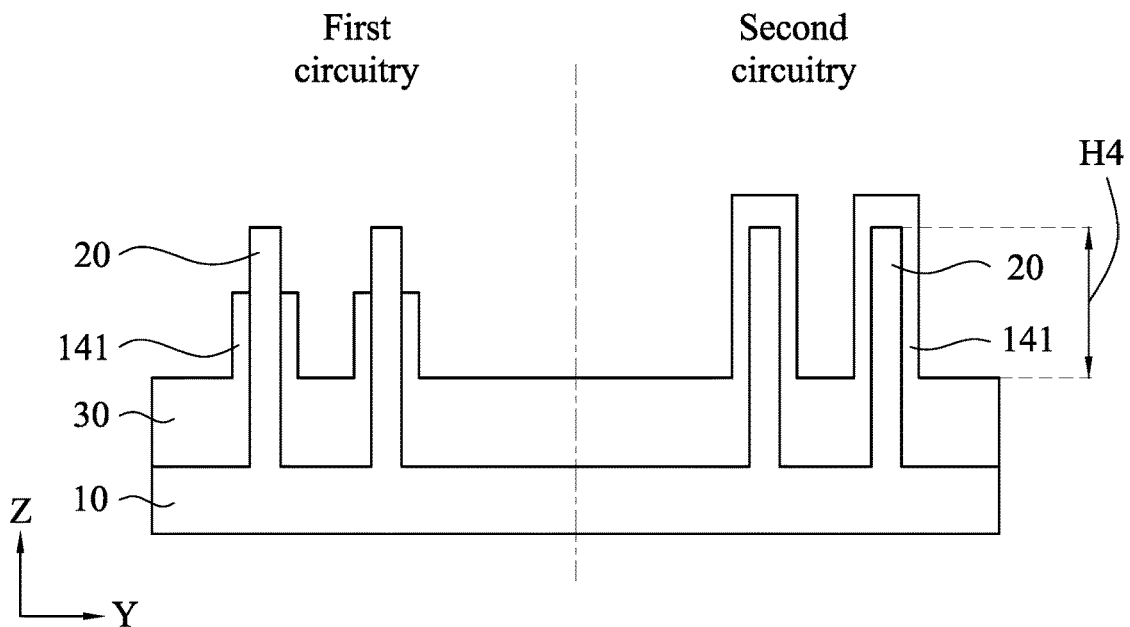
FIG. 21 illustrates one of the various stages of a semiconductor device fabrication process in accordance with another embodiment of the present disclosure.
Figure 22:
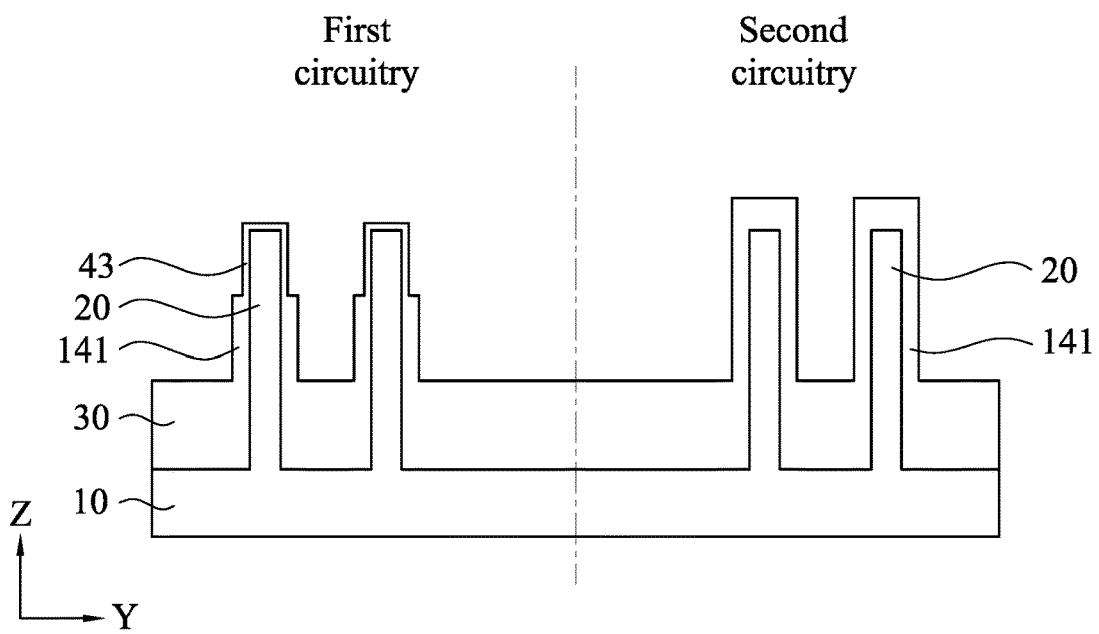
FIG. 22 illustrates one of the various stages of a semiconductor device fabrication process in accordance with another embodiment of the present disclosure.

Subsequently, by using the similar or same operations as explained with respect to FIG. 10, the remaining protective layer 110 is removed, and further the cover layer 100 is removed as shown in FIG. 21. Then, by using the similar or same operations as explained with respect to FIG. 11, the fin structures 20 with the sacrificial gate dielectric layer 141 are further oxidized to form an interfacial dielectric layer 43, as shown in FIG. 22. Subsequently, similar to FIGS. 12-14, a metal gate electrode is formed.

In the present disclosure, the FinFET for the first circuitry has a thin gate dielectric layer 43 at an upper portion of the fin structure and a thick gate dielectric layer 41 at a bottom portion of the fin structure above the isolation insulating layer 30. An effective channel region is the upper portion of the fin structure 20 in the first circuitry. Accordingly, the FinFET in the first circuitry is low power consumption and low current leakage, compared with a FinFET having a uniform thin gate dielectric layer with a higher fin structure above the isolation insulating layer.

As set forth above, multi-patterning processes combining photolithography and self-aligned processes generally result in forming a pair of fin structures. In some embodiments, a pair of fin structures (two fin structures) are used for one FinFET. If a FinFET includes one fin structure, one of the pair of the fin structures is removed, which requires fine lithography and etching operations. In some embodiments, one circuitry (e.g., core circuits) requires a lower power consumption and a lower current driving capacity than other circuitry (e.g., I/O region). In such a case, the one circuitry employs FinFETs having one fin structure and the other circuitry employs FinFETs having two (or more) fin structures. As set forth above, however, forming FinFETs having one fin structure requires one or more additional fin lithography and etching operations.

According to the embodiments of the present disclosure, a FinFET having a lower power consumption and a lower current driving capacity, which is similar to a FinFET having one fin structure, can be realized by a pair of fin structures having shorter channel height (H5 shown in FIG. 10). When the height H5 is about 30-70% or 40-60% of the height H4, the FinFET shown in FIG. 12 or 14 has a current driving capacity of 60-140% or 80-120% of a FinFET including one fin structure having a height H4. Further, since the lower portion of the fin structure above the isolation insulating layer is covered by the gate electrode, it is possible to reduce a leakage current.

It will be understood that not all advantages have been necessarily discussed herein, no particular advantage is required for all embodiments or examples, and other embodiments or examples may offer different advantages.

In accordance with an aspect of the present disclosure, in a method for manufacturing a semiconductor device, a fin structure is formed over a substrate, an isolation insulating layer is formed over the substrate such that an upper portion of the fin structure protrudes from the isolation insulating layer, a first dielectric layer is formed on the upper portion of the fin structure, a cover layer is formed on the first dielectric layer, the cover layer is partially removed from an upper part of the upper portion of the fin structure with the first dielectric layer, the first dielectric layer is removed from the upper part of the upper portion of the fin structure, a second dielectric layer is formed on the upper part of the upper portion of the fin structure, and a gate electrode is formed on the second dielectric layer and the first dielectric layer disposed on an lower part of the upper portion of the fin structure. In one or more of the foregoing or following embodiments, the first dielectric layer is formed by a deposition method. In one or more of the foregoing or following embodiments, the second dielectric layer is formed by an oxidation method. In one or more of the foregoing or following embodiments, a thickness of the first dielectric layer is in a range from 0.4 nm to 4 nm. In one or more of the foregoing or following embodiments, a thickness of the second dielectric layer is smaller than a thickness of the first dielectric layer. In one or more of the foregoing or following embodiments, a thickness of the first dielectric layer is in a range from 0.2 nm to 1.0 nm. In one or more of the foregoing or following embodiments, the cover layer is formed by applying hexamethyldisilazane on the first dielectric layer. In one or more of the foregoing or following embodiments, the cover layer is a mono layer of an organic material. In one or more of the foregoing or following embodiments, before the gate electrode is formed, a high-k dielectric layer is formed on the first and second dielectric layers. In one or more of the foregoing or following embodiments, after the cover layer is partially removed, a height of the remaining cover layer is 30% to 70% of a height of the upper portion of the fin structure measured from an upper surface of the isolation insulating layer.

In accordance with another aspect of the present disclosure, in a method of manufacturing a semiconductor device, a first pair of fin structures are formed over a substrate, an isolation insulating layer is formed over the substrate such that upper portions of the first pair of fin structures protrude from the isolation insulating layer, a first dielectric layer is formed on the upper portions of the first pair of fin structures, a cover layer is formed on the first dielectric layer, the cover layer is partially removed from upper parts of the upper portions of the first pair of fin structures with the first dielectric layer, the first dielectric layer is removed from the upper parts of the upper portions of the first pair of fin structures, a second dielectric layer is formed on the upper parts of the upper portions of the first pair of fin structures, and a gate electrode is formed on the second dielectric layer and the first dielectric layer disposed on lower parts of the upper portions of the first pair of fin structures. In one or more of the foregoing or following embodiments, the cover layer is formed by applying hexamethyldisilazane on the first dielectric layer. In one or more of the foregoing or following embodiments, the cover layer is a mono layer of an organic material. In one or more of the foregoing or following embodiments, the second dielectric layer is formed by an oxidation method. In one or more of the foregoing or following embodiments, the cover layer is removed after removing the first dielectric layer from the upper parts of the upper portions of the first pair of fin structures. In one or more of the foregoing or following embodiments, the cover layer is removed by using oxygen containing plasma.

In accordance with another aspect of the present disclosure, in a method of manufacturing a semiconductor device, a first pair of fin structures and a second pair of fin structures are formed over a substrate, an isolation insulating layer is formed over the substrate such that upper portions of the first pair of fin structures and upper portions of the second pair of fin structures protrude from the isolation insulating layer, a first dielectric layer is formed on the upper portions of the first pair of fin structures and the upper portions of the second pair of fin structures, a cover layer is formed on the first dielectric layer, the cover layer is partially removed from upper parts of the upper portions of the first pair of fin structures with the first dielectric layer, the first dielectric layer is removed from the upper parts of the upper portions of the first pair of fin structures, a second dielectric layer is formed on the upper parts of the upper portions of the first pair of fin structures, and a first gate electrode is formed on the second dielectric layer and the first dielectric layer disposed on lower parts of the upper portions of the first pair of fin structures and a second gate electrode is formed on the first dielectric layer of the second pair of fin structures. In one or more of the foregoing or following embodiments, a protective layer is formed to cover the second pair of fin structures, before partially removing the cover layer, and the protective layer is removed after removing the first dielectric layer from the upper parts of the upper portions of the first pair of fin structures. In one or more of the foregoing or following embodiments, the cover layer is removed after removing the first dielectric layer from the upper parts of the upper portions of the first pair of fin structures. In one or more of the foregoing or following embodiments, the cover layer is formed before forming the protective layer.

In accordance with one aspect of the present disclosure, a semiconductor device includes a fin structure disposed over a substrate, an isolation insulating layer, an upper portion of the fin structure protruding from the isolation insulating layer, a first dielectric layer disposed on a lower part of the upper portion of the fin structure, a second dielectric layer disposed on an upper part of the upper portion of the fin structure, and a gate electrode disposed over the first and second dielectric layers. A thickness of the second dielectric layer is smaller than a thickness of the first dielectric layer. In one or more of the foregoing or following embodiments, the thickness of the second dielectric layer is 0.2 nm to 1.0 nm. In one or more of the foregoing or following embodiments, the thickness of the first dielectric layer is 0.4 nm to 4.0 nm. In one or more of the foregoing or following embodiments, at least the upper portion of the fin structure includes SiGe. In one or more of the foregoing or following embodiments, a height of the upper part of the upper portion is 30% to 70% of a height of the upper portion of the fin structure measured from an upper surface of the isolation insulating layer. In one or more of the foregoing or following embodiments, the first and second dielectric layers are made of silicon oxide. In one or more of the foregoing or following embodiments, the semiconductor device further includes a high-k dielectric layer disposed on the first and second dielectric layers.

In accordance with another aspect of the present disclosure, a semiconductor device includes a pair of fin structures disposed over a substrate, an isolation insulating layer, upper portions of the pair of fin structure protruding from the isolation insulating layer, a first dielectric layer disposed on lower parts of the upper portions of the pair of fin structures, a second dielectric layer disposed on upper parts of the upper portions of the pair of fin structures, and a gate electrode disposed over the first and second dielectric layers of the pair of fin structures. A thickness of the second dielectric layer is smaller than a thickness of the first dielectric layer. In one or more of the foregoing or following embodiments, the thickness of the second dielectric layer is 0.3 nm to 0.8 nm. In one or more of the foregoing or following embodiments, the thickness of the first dielectric layer is 1.0 nm to 3.0 nm. In one or more of the foregoing or following embodiments, a height of the upper part of the upper portion is 40% to 60% of a height of the upper portion of the fin structure measured from an upper surface of the isolation insulating layer. In one or more of the foregoing or following embodiments, the first and second dielectric layers are made of silicon oxide. In one or more of the foregoing or following embodiments, the semiconductor device further includes a high-k dielectric layer disposed on the first and second dielectric layers.

In accordance with another aspect of the present disclosure, a semiconductor device includes a pair of first fin structures and a second fin structure, disposed over a substrate, an isolation insulating layer, upper portions of the pair of first fin structure and an upper portion of the second fin structure protruding from the isolation insulating layer, a first dielectric layer disposed on lower parts of the upper portions of the pair of first fin structures, a second dielectric layer disposed on upper parts of the upper portions of the pair of first fin structures, a third dielectric layer disposed on the upper portion of the second fin structure, a first gate electrode disposed over the first and second dielectric layers of the pair of fin structures, and a second gate electrode disposed over the third dielectric layer of the second fin structure. A thickness of the second dielectric layer is smaller than a thickness of the first dielectric layer. In one or more of the foregoing or following embodiments, the thickness of the second dielectric layer is smaller than a thickness of the third dielectric layer. In one or more of the foregoing or following embodiments, the thickness of the second dielectric layer is 0.3 nm to 0.8 nm. In one or more of the foregoing or following embodiments, the thickness of the first dielectric layer is 1.0 nm to 3.0 nm. In one or more of the foregoing or following embodiments, a height of the upper part of the upper portion is 40% to 60% of a height of the upper portion of the first fin structure measured from an upper surface of the isolation insulating layer. In one or more of the foregoing or following embodiments, the first, second and third dielectric layers are made of silicon oxide. In one or more of the foregoing or following embodiments, the semiconductor device further includes a high-k dielectric layer disposed on the first and second dielectric layers, and on the third dielectric layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a first fin structure and a second fin structure disposed over a substrate;
 an isolation insulating layer, an upper portion of the first and second fin structures protruding from the isolation insulating layer;
 a first dielectric layer disposed on a lower part of the upper portion of the first fin structure and disposed on a lower part and an upper part of the upper portion of the second fin structure;
 a second dielectric layer disposed on an upper part of the upper portion of the first fin structure;
 a first gate electrode disposed over the first and second dielectric layers disposed on the first fin structure; and
 a second gate electrode disposed over the first dielectric layer disposed on the second fin structure,
 wherein a thickness of the second dielectric layer is smaller than a thickness of the first dielectric layer disposed over the first fin structure and the second fin structure, and
 wherein a height of the upper part of the upper portion is 40% to 60% of a height of the upper portion of the first and second fin structures measured from an upper surface of the isolation insulating layer to an uppermost surface of the first and second fin structures.

2. The semiconductor device of claim 1, wherein the thickness of the second dielectric layer is 0.2 nm to 1.0 nm.

3. The semiconductor device of claim 1, wherein the thickness of the first dielectric layer is 0.4 nm to 4.0 nm.

4. The semiconductor device of claim 1, wherein at least the upper portion of the first fin structure includes SiGe.

5. The semiconductor device of claim 1, wherein the first and second dielectric layers are made of silicon oxide.

6. The semiconductor device of claim 5, further comprising a high-k dielectric layer disposed over the first and second dielectric layers.

7. A semiconductor device, comprising:
 a first pair of fin structures disposed over a substrate;
 an isolation insulating layer, upper portions of the first pair of fin structures protruding from the isolation insulating layer;
 a first dielectric layer disposed on lower parts of the upper portions of the first pair of fin structures;
 a second dielectric layer disposed on upper parts of the upper portions of the first pair of fin structures;
 a first gate electrode disposed over the first and second dielectric layers of the first pair of fin structures;
 a second pair of fin structures disposed over the substrate,
 wherein upper portions of the second pair of fin structures protrude from the isolation insulating layer, and
 the first dielectric layer is disposed on lower parts and upper parts of the upper portions of the second pair of fin structures; and
 a second gate electrode disposed over the first dielectric layer of the second pair of fin structures,
 wherein the first gate electrode includes a recess between the pair of fin structures, wherein a thickness of the second dielectric layer is smaller than a thickness of the first dielectric layer disposed over the first and second pairs of fin structures, and wherein a height of the upper parts of the upper portions is 30% to 70% of a height of the upper portions of the fin structures measured from an upper surface of the isolation insulating layer to uppermost surfaces of the first and second pairs of fin structures.

8. The semiconductor device of claim 7, wherein the thickness of the second dielectric layer is 0.3 nm to 0.8 nm.

9. The semiconductor device of claim 8, wherein the thickness of the first dielectric layer is 1.0 nm to 3.0 nm.

10. The semiconductor device of claim 7, wherein the height of the upper parts of the upper portions is 40% to 60% of the height of the upper portions of the first and second pairs of fin structures measured from the upper surface of the isolation insulating layer to the uppermost surfaces of the first and second pairs of fin structures.

11. The semiconductor device of claim 7, wherein the first and second dielectric layers are made of silicon oxide.

12. The semiconductor device of claim 7, further comprising a high-k dielectric layer disposed over the first and second dielectric layers.

13. The semiconductor device of claim 7, wherein the recess is V-shaped.

14. A semiconductor device, comprising:
a pair of first fin structures and a second fin structure, disposed over a substrate;
an isolation insulating layer, upper portions of the pair of first fin structure and an upper portion of the second fin structure protruding from the isolation insulating layer;
a first dielectric layer disposed on lower parts of the upper portions of the pair of first fin structures;
a second dielectric layer disposed on upper parts of the upper portions of the pair of first fin structures;
a third dielectric layer disposed on the upper portion of the second fin structure;
a first gate electrode disposed over the first and second dielectric layers of the pair of fin structures; and
a second gate electrode disposed over the third dielectric layer of the second fin structure, wherein the first gate electrode includes a recess between the pair of first fin structures, wherein a thickness of the second dielectric layer is smaller than a thickness of the first dielectric layer and a thickness of the third dielectric layer, and wherein a height of the upper parts of the upper portions is 30% to 70% of a height of the upper portions of the fin structures measured from an upper surface of the isolation insulating layer to an uppermost surface of the pair of first fin structures and the second fin structure.

15. The semiconductor device of claim 14, wherein the thickness of the second dielectric layer is 0.3 nm to 0.8 nm.

16. The semiconductor device of claim 15, wherein the thickness of the first dielectric layer is 1.0 nm to 3.0 nm.

17. The semiconductor device of claim 14, wherein the height of the upper parts of the upper portions is 40% to 60% of the height of the upper portions of the first fin structures measured from the upper surface of the isolation insulating layer to an uppermost surface of the first fin structures and the second fin structure.

18. The semiconductor device of claim 14, wherein the first, second and third dielectric layers are made of silicon oxide.

19. The semiconductor device of claim 14, further comprising a high-k dielectric layer disposed over the first and second dielectric layers, and on the third dielectric layer.

20. The semiconductor device of claim 14, wherein the recess is V-shaped.

* * * * *